United States Patent [19]

Liptak

[11] 4,099,227
[45] Jul. 4, 1978

[54] SENSOR CIRCUIT

[75] Inventor: Julius M. Liptak, Columbia, S.C.

[73] Assignee: Square D Company, Park Ridge, Ill.

[21] Appl. No.: 746,279

[22] Filed: Dec. 1, 1976

[51] Int. Cl.² .............................................. H02M 7/08
[52] U.S. Cl. .................................. 363/126; 323/119; 340/210; 363/45
[58] Field of Search ............................ 321/5, 8 R, 47; 324/107, 119, 140 R; 340/210; 363/2, 3, 125, 126, 44, 45; 323/119

[56] References Cited
U.S. PATENT DOCUMENTS

| | | | |
|---|---|---|---|
| 1,745,841 | 2/1930 | Bradbury | 363/126 |
| 2,895,059 | 7/1959 | Bell | 363/45 |
| 3,568,032 | 3/1971 | Mages et al. | 321/5 |
| 3,571,707 | 3/1971 | Houck | 324/107 |
| 3,584,286 | 6/1971 | Randall | 323/119 |
| 3,846,692 | 11/1974 | Hill | 321/8 R |

Primary Examiner—Gerald Goldberg
Attorney, Agent, or Firm—Michael J. Femal; William H. Schmeling

[57] ABSTRACT

A circuit for sensing the motor stator voltage on any one or more phases of an AC electrical drive system. In a three phase system, all three phases of the motor terminal voltage are applied to a modified six-pulse rectifier bridge which in turn feeds a loading resistor. A resistor is added in series with each diode pair of the six-pulse rectifier bridge in order to provide any degree of attenuation of the peak voltage developed across the load resistor by simply varying the resistance values of these series input resistors and the load resistor. The resulting DC voltage generated across the load resistor is then fed into a differential amplifier (stage) where the voltage is attenuated and impedance isolated from the source to provide a DC output which is proportional to the average applied AC motor stator voltage.

6 Claims, 1 Drawing Figure

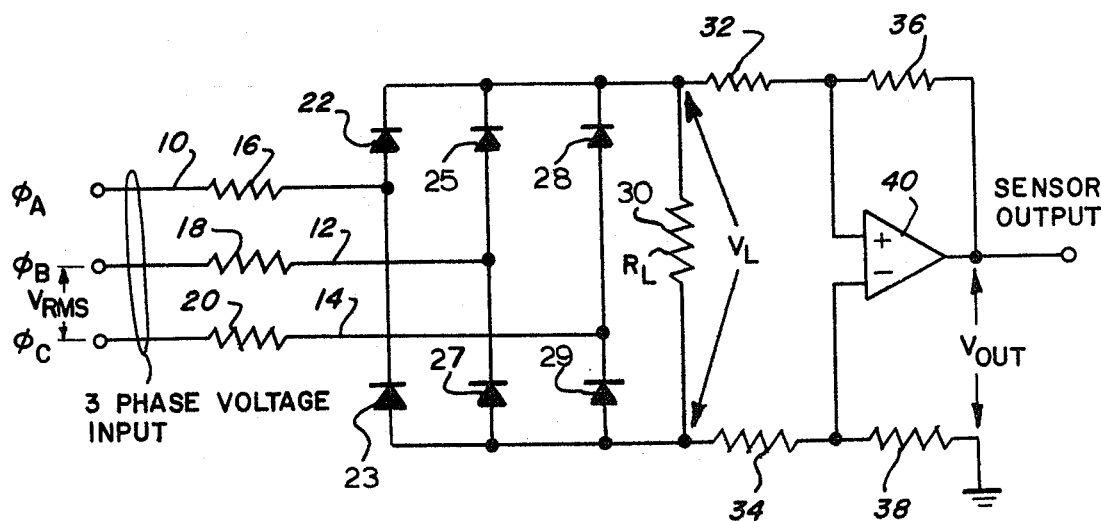

SENSOR CIRCUIT

BACKGROUND OF THE INVENTION

This invention relates to a sensor circuit for an AC drive system and is more particularly concerned with a solid state type sensor circuit that will generate an output signal which is proportional to the average value of the applied voltages of one or more electrical phases in the AC drive system.

Previously, adjustable voltage AC drive systems had utilized voltage feedback loops to correct for variations in the incoming line voltages to the controller of the circuit and to compensate for component tolerances within the drive circuits. The voltage feedback sensors incorporated into the older drive systems have traditionally been of the transformer-isolated type and, in these units, only one phase of a three phase voltage being applied to the motor was monitored. Furthermore, in this prior type of sensor circuit, the applied motor stator teminal voltage was stepped down by a transformer, rectified, and then filtered to produce a DC output voltage or current which was proportional to the terminal voltage applied to the motor.

The transformer-isolated sensor circuit had several drawbacks. First, the circuit sensed only one phase of the motor terminal voltage. Secondly, the voltage output of the transformer, once rectified, then needed a substantial amount of filtering to remove the low frequency ripple in order to produce a useable DC signal. Naturally, this type of filtering resulted in a large filtered time constant which further resulted in the response of the sensor circuit to be inherently slow and sluggish which resulted in unstable drive peformance. Next, the cost of the transformer, when compared to other circuit components, was high. In addition, the transformers were bulky, and did not always accurately reproduce the motor stator terminal voltage due to the high harmonic content of the voltage waveform.

Practically, all of these older type of sensor circuits required a number of components that are undesirably large for some applications, and it was in an effort to provide a sensor circuit with better operating capability and with simplier and less costly circuit components that the present invention came about.

SUMMARY OF THE INVENTION

With this invention, the foregoing problems are substantially solved. In accordance with the present invention, a sensor circuit is provided in which signals proportional to the magnitude of each phase voltage are applied across a load. These signals are full-wave rectified phase voltages. The peak voltage developed across the load is held to a predetermined value by resistor attenuation. The desired amount of resistor attenuation is achieved by selecting the values of the resistor or by varying the values of the resistors in series between each phase conductor and a six-pulse rectifier bridge and by varying the value of the load resistor which cooperates with the series input resistors. The voltage developed across the load resistor is then fed into a differential amplifier which generates a positive output signal that is proportional to the average applied system voltage of the electrical phases. This positive DC output voltage of the sensor circuit is then used in conjunction with a voltage regulator circuit to control the applied motor stator terminal voltage.

DESCRIPTION OF THE DRAWING

Further objects and features of the invention will be readily apparent to those skilled in the art from the following specification and from the appended drawing illustrating certain preferred embodiments, in which:

The drawing shown is a schematic wiring diagram of one embodiment of the present invention.

DESCRIPTION OF THE PREFERRED EMBODIMENT

Referring to the drawing, a sensor circuit is shown for a polyphase electrical system of three phases, phases A, B, and C on lines 10, 12 and 14 respectively.

The phase conductors 10, 12 and 14 have input resistors 16, 18 and 20 inserted therein, respectively. The input resistors are connected in series with a modified six-pulse rectifier bridge for a three phase system including oppositely poled diodes 22 and 23 connected to line 10, opppositely poled diodes 25 and 27 connected to line 12, and oppositely poled diodes 28 and 29 connected to line 14. The output of the three phase rectifier with the series input resistors feeds a loading resistor ($R_L$) 30. The resulting DC voltage ($V_L$) generated across the load resistor 30 is then fed into the positive input of a differential amplifier 40 through a resistor 32. The negative input of the differential amplifier 40 is isolated from the negative terminal of load resistor 30 by a resistor 34. The negative input terminal of the differential amplifier 40 is connected to a common reference point "floating" with respect to the power system through resistor 38. The operational amplifier 40 also includes a feedback loop from its output terminal through resistor 36 to the positive input terminal thereof.

The sensor circuit is described for application to a three phase system, although it will be understood that corresponding circuits may be formed for systems of other numbers of phases of one or more such as, for example, a full-wave bridge rectifier minus a series input resistor for single phase. The principal advantages of the circuit, however, are in polyphase systems.

This sensor circuit takes a different approach to the problem of developing a voltage feedback signal from the applied terminal voltage of the motor. The circuit functions in the following manner. All three phases of the motor terminal voltage are applied to a modified six-pulse rectifier bridge which feeds the loading resistor 30. The resulting DC voltage generated across the loading resistor 30 is then feed into the differential amplifier stage 40 where the voltage is attenuated and impedance isolated from the source. The resulting DC output signal ($V_{out}$) of the differential amplifier 40 is a positive voltage level which is proportional to the average value of the voltage applied to the AC motor stator on phase lines 10, 12 and 14.

Although the differential amplifier stage 40 of the circuit is of a conventional design, the modified six-pulse bridge arrangement is not. Due to the series input resistors 16, 18, and 20 which have been added in series with each diode pair, the standard design equations for a six-pulse bridge with resistive load no longer apply. An analysis was carried out to determine key parameters necessary for successful application of the bridge circuit with a differential amplifier 40. Such analysis is capable of being carried out by anyone skilled in the art.

The peak and average DC voltage developed across the load resistor 30 are of a prime importance. The average DC voltage across the load resistor 30 for a given three phase (balance) sinusoidal signal applied to the bridge input is given by the following expression.

$$V_L\big|_{Avg} = \frac{6V_p}{\pi}\left[\frac{R_L(\cos(\theta))}{2R_1 + R_L} + \frac{R_L(\cos(\theta - 120°) - \cos(\theta))}{3R_1 + 2R_L}\right] \quad \text{EQ. 1}$$

where: $\theta = 120° - 60°\left[\frac{R_1 + R_L}{2R_1 + R_L}\right]$ $V_p = \sqrt{2}\ V_{RMS}$ $V_{RMS}$ = Applied RMS Line Voltage The peak voltage developed across the load resistor 30 for a given three phase (balance) sinusoidal signal applied to the bridge input is given by the following expressions.

$$V_L\big|_{Peak} = \frac{V_p R_L}{2R_1 + R_L} \quad \text{For } R_1 < .5773\ R_L \quad \text{EQ. 2}$$

$$V_L\big|_{Peak} = \frac{V_p R_L \sqrt{3}}{3R_1 + 2R_L} \quad \text{For } R_1 > .5773\ R_L \quad \text{EQ. 3}$$

The only major design parameter which is not readily determined on the mathematical model is the common-mode voltage ratings necessary on the differential amplifier 40. This parameter varies depending upon the voltage relationship of a differential amplifier common reference point with respect to the power system being monitored. Since the reference point may be either "floating", solidly grounded to the power system neutral, or tied to one leg on the power system, a general analytic solution to the common mode voltage generator of the differential amplifier 40 input resistors is not readily derived.

However, this reference point can be dealt with empirically after laboratory tests. The proper common mode voltage rating for the differential amplifier 40 was determined in these tests that the common reference point "floating" with respect to the power system would be preferred. All present applications of this circuit are made with the circuit common bus floating with respect to the power system, but the other modes listed above could be used.

By using the modified six-pulse bridge arrangement in conjunction with the differential amplifier 40, several distinct advantages are gained over the standard transformer-isolated voltage sensor.

One obvious advantage is the elimination of the transformers. The parts utilized throughout are inexpensive and no distortion of the three-phase waveform will occur provided that the differential amplifier 40 differential mode and common mode voltge design ratings are properly chosen.

Since all three phases of the three phase system are monitored, an additional advantage is gained in that the fundamental ripple frequency of the DC output of the differential amplifier 40 is three times that of a sensor circuit which monitors only one phase. This means that smaller output filter time constants may be utilized, and the voltage sensor response time is consequently decreased. The small response time improves the performance of the voltge regulator loop of the drive system by lowering the overall response time of the feedback loop and improving regulation due to power line variations.

One further advantage of the voltage sensor circuit is the use of relatively low reverse-voltage diodes. The benefit of inserting series input resistors in line with the diode pairs becomes apparent upon examination of equations (2) & (3). By varying the resistance of the resistors 16, 18 and 20 and the load resistor 30, any degree of attenuation of the peak voltage developed across the load resistor 30 may be realized. The resulting peak reverse voltage across each diode is then reduced, and, even on a 480 volt three phase system, 200 volt peak reverse voltage diodes may be utilized, conservatively. The conservative application of the diodes with the reduced operating voltages at the diodes permits greater voltage clearances in the use of the sensor circuit on plug-in type printed circuit cards for a wide variety of applications. Another important feature of the added three input resistors is the limiting of destructive and dangerous currents in the event that a fault should occur in the wiring or the diodes. Other advantages of the sensor circuit is that it monitors six pulses per cycle which is the real time instead of a delayed time in a transformer type sensor circuit. Therefore the output of the sensor circuit is proportional to the true average value of the three phase input voltage.

In the present circuit as shown, the output of the differential amplifier 40 varies from zero to ten volts DC. If the applied motor stator terminal three phase voltage is 100%, then the output voltage on the differential amplifier 40 would be 10 volts. If the input voltage was 50% then the output voltage on amplifier 40 would be 5 volts and, if the input voltage was zero percent, then the output voltage of amplifier 40 would be zero. These output voltages of the differential amplifier 40 are summed with a reference voltage which may vary from zero to a minus 10 volts DC and then, the resulting error signal changes the gating of control thyristors in the motor stator terminal voltage circuit to eliminate any error.

I claim:
1. A voltage sensing circuit for AC electrical drive systems having at least one electrical phase comprising:
   a resistive load;
   means responsive to each phase voltage for generating signals proportional to the magnitude of each phase voltage across the load;
   resistive means connected in series between each phase conductor and the generating means cooperating with the load for attenuating the peak voltage developed across the load to a predetermined value; and
   means responsive to the voltage across the load for generating an output signal which is proportional to the average applied system voltage of the electrical phases.
2. The sensing circuit of claim 1 wherein:
   said means for generating an output signal is a differential amplifier where the voltage across the load is attenuated and impedance isolated from the source; and
   said output voltage is a positive DC signal ranging from 0 to 10 volts.
3. The sensing circuit of claim 1 wherein:

said load is a resistor connected between said means for generating signals proportional to the magnitude of each phase voltage and said output signal generating means.

4. The sensing circuit of claim 1 wherein:

said means for generating signals proportional to the magnitude of each phase voltage comprises a six-pulse rectifier bridge which feeds the load.

5. The sensing circuit of claim 1 wherein: said resistive attenuating means comprises a resistor in series between each electrical phase and said means for generating signals proportional to the magnitude of each phase voltage.

6. The sensing circuit of claim 1, wherein:

said means for generating signals proportional to the magnitude of each phase voltage comprises a full-wave rectifier bridge which feeds the load in a drive system having a single phase.

* * * * *